United States Patent [19]
Lin

[11] Patent Number: 6,028,363
[45] Date of Patent: Feb. 22, 2000

[54] VERTICAL VIA/CONTACT

[75] Inventor: Yung-Fa Lin, Hsinchu, Taiwan

[73] Assignee: Taiwan Semiconductor Manufacturing Company, Hsin-Chu, Taiwan

[21] Appl. No.: 09/268,541

[22] Filed: Mar. 15, 1999

Related U.S. Application Data

[62] Division of application No. 08/869,021, Jun. 4, 1997, Pat. No. 5,897,374.

[51] Int. Cl.⁷ .................................................... H01L 23/48
[52] U.S. Cl. ......................... 257/774; 257/773; 257/774; 257/775
[58] Field of Search ..................................... 257/773, 774, 257/775

[56] References Cited

U.S. PATENT DOCUMENTS

| | | | |
|---|---|---|---|
| 4,879,257 | 11/1989 | Patrick | 437/195 |
| 4,902,377 | 2/1990 | Bergland et al. | 156/643 |
| 4,997,789 | 3/1991 | Keller et al. | 437/192 |
| 5,470,790 | 11/1995 | Myers et al. | 437/192 |
| 5,619,071 | 4/1997 | Myers et al. | 257/753 |
| 5,684,331 | 11/1997 | Jun | 257/758 |
| 5,717,247 | 2/1998 | Koh et al. | 257/686 |
| 5,847,460 | 12/1998 | Liou et al. | 257/751 |
| 5,852,328 | 12/1998 | Nishimuara et al. | 257/774 |
| 5,874,778 | 2/1999 | Bhattachryya et al. | 257/758 |
| 5,883,335 | 3/1999 | Mizumoto et al. | 174/266 |

OTHER PUBLICATIONS

Rooted Refracory Metal on Al–Cu Semiconductor Structure For Improved Contact And Enhanced Electromigration Resistance, IBM, Technical Disclosure Bulletin, vol. 34 No. 4B, Sep. 1991.

*Primary Examiner*—Mahshid Saadat
*Assistant Examiner*—Edgardo Ortiz
*Attorney, Agent, or Firm*—Rosemary L. S. Pike

[57] ABSTRACT

An integrated circuit device with a vertical via/contact is described. An insulating layer covers semiconductor device structures in and on a semiconductor substrate. A conducting layer overlies the insulating layer. An intermetal dielectric layer overlies the conducting layer. An aluminum layer overlies the intermetal dielectric layer and fills a via hole extending through the intermetal dielectric layer and through the conducting layer wherein the said via hole includes an undercutting of the intermetal dielectric layer and wherein the portion of the via hole undercutting the interlevel dielectric layer has vertical sidewalls. The via hole may extend either partially through the conducting layer or all the way through the conducting layer to the underlying insulating layer. This completes the integrated circuit device.

13 Claims, 2 Drawing Sheets

VERTICAL VIA/CONTACT

This is a division of patent application Ser. No. 08/869,021, filing date Jun. 4, 1997 now U.S. Pat. No. 5,897,374, Vertical Via/Contact, assigned to the same assignee as the present invention.

BACKGROUND OF THE INVENTION (1) Field of the Invention

The invention relates to a method of metallization of an integrated circuit device, and more particularly, to a metallization method with improved interface area and interface mechanical properties in the manufacture of an integrated circuit device.

(2) Description of the Prior Art

In the fabrication of integrated circuit devices, metal layers make contact to lower conductive layers of the integrated circuit through vias in an insulating layer. Referring to FIG. 1, there is shown a contact of the prior art. A via or contact opening has been made through insulating layer 16 to lower conductive layer 14 on a semiconductor substrate. Top metal layer 20 contacts the top side of the bottom conductive layer 14. Some disadvantages of the conventional contact are the small interface area between the conductors and severe surface damage, residue, or contamination to the top side of the bottom conductive layer contacted by the top metal layer.

U.S. Pat. No. 5,231,053 to Bost et al shows etching a via hole into a trimetal layer and forming a tungsten plug within the via hole. U.S. Pat. No. 4,997,789 to Keller et al shows etching through an Aluminum layer, then filling the hole, and overlaying with tungsten.

SUMMARY OF THE INVENTION

A principal object of the present invention is to provide an effective and very manufacturable method of metallization in the manufacture of an integrated circuit with increased conductor-to-conductor interface area.

Another object of the invention is to provide a method of metallization with reduced contact interface damage, residue, or contamination.

A further object is to provide a method of metallization with improved interface mechanical properties between conductors.

In accordance with the objects of this invention a new method of metallization of an integrated circuit is achieved. A dielectric layer is provided over a first conducting layer over an insulating layer over a semiconductor substrate. The dielectric layer is covered with a layer of photoresist which is patterned to provide a photoresist mask. At least one via hole is etched through the dielectric layer to the first conducting layer. The photoresist mask is removed. The via hole is etched through the first conducting layer resulting in an undercutting of the dielectric layer. The exposed surfaces of the first conducting layer are cleaned. The insulating layer overhang protects the exposed surfaces from damage or contamination. A second conducting layer is deposited over the surface of the dielectric layer and within the via hole completing the metallization in the fabrication of the integrated circuit.

BRIEF DESCRIPTION OF THE DRAWINGS

In the accompanying drawings forming a material part of this description, there is shown.

DESCRIPTION OF THE PREFERRED EMBODIMENTS

Figure 2:
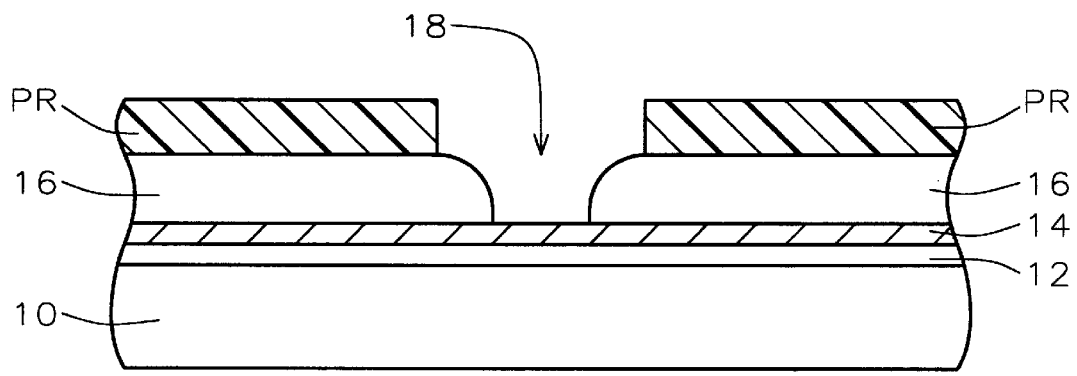
FIGS. 2 through 6 schematically illustrate in cross-sectional representation a preferred embodiment of the present invention.

Referring now to FIG. 2, there is shown a portion of a partially completed integrated circuit. The semiconductor substrate 10 is preferably composed of monocrystalline silicon. Semiconductor device structures, such as gate electrodes and source and drain regions, not shown, are formed in and on the semiconductor substrate and are included within the region labeled 10. An insulating layer 12, preferably composed of silicon oxide formed using tetraethoxysilane (TEOS), borophosphosilicate glass (BPSG), or the like, is deposited to a thickness of between about 5000 to 10,000 Angstroms over the semiconductor device structures.

A first conducting layer 14 is deposited over the insulating layer 12 to a thickness of between about 4000 to 7000 Angstroms. The conducting layer 14 may be composed of a barrier metal layer such as titanium and titanium nitride or titanium tungsten, the contact metal layer such as aluminum, AlSiCu, or AlCu, and an anti-reflective coating (ARC) layer such as titanium nitride.

An intermetal dielectric layer 16 is deposited over the first conducting layer 14. The dielectric layer may be composed of silicon oxide formed by plasma enhanced chemical vapor deposition of oxide or TEOS, cured spin-on-glass, or the like and has a thickness of between about 5000 to 10,000 Angstroms. A layer of photoresist is coated over the dielectric layer and patterned to form a photoresist mask, not shown.

A via 18 is etched through the dielectric layer to the surface of the first conducting layer using a $CF_4$ or $CHF_3$ based plasma, for example.

Figure 3:
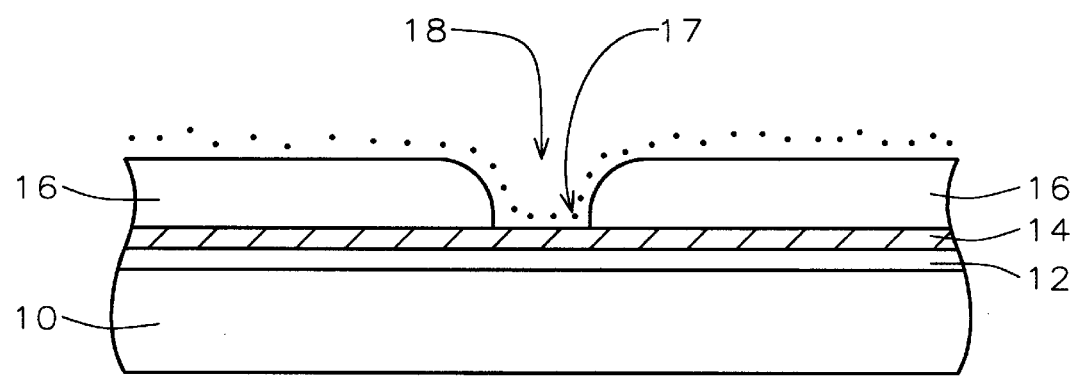

Referring to FIG. 3, the photoresist mask is stripped using oxygen plasma and an amine based net strip. The photoresist stripping results in polymer residue and surface damage to the exposed conducting layer 17. The polymer residue is a byproduct of the interaction between the oxygen plasma and the photoresist material.

Figure 4:
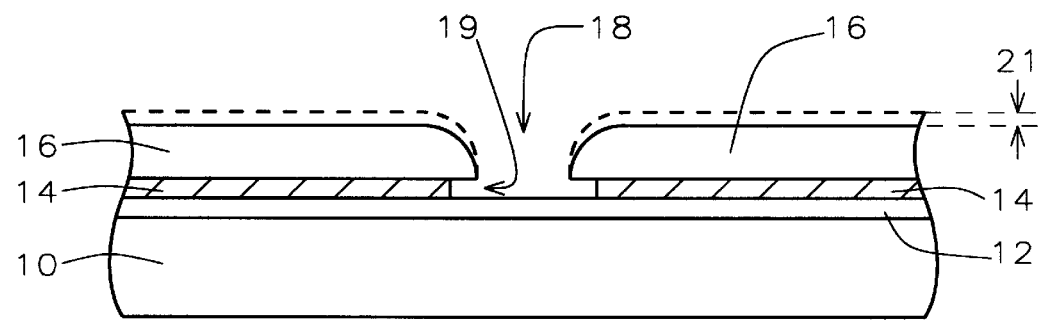

The key vertical via/contact of the invention will now be described, referring to FIG. 4. The via opening 18 is extended into the first conducting layer 14. An isotropic plasma etch using, for example, a $Cl_2$ or $CF_4$ base such as Applied Materials 8330 at low power of between about 20 to 100 watts can etch away all components of metal layer 14, including the barrier layer and ARC. The purpose of the isotropic plasma etch is two-fold. First, the etching must stop at the insulating layer 12. An anisotropic etch could go into or through the insulating layer. Secondly, an undercut 19 is formed under the dielectric layer 16. This increases the diameter of the contact and thus increases the area of the contact between the first and second conducting layers. The undercutting also provides a protection for the sidewalls of the via during the subsequent cleaning process.

Since the photoresist mask has been removed before the conducting layer 14 is etched, no polymer buildup occurs on the conducting layer during etching. A side effect of the isotropic plasma etch is the removal of the polymer residue 17 and the loss 21 of less than about 100 Angstroms of the dielectric thickness. The wafer is now cleaned using deionized water.

Figure 5:
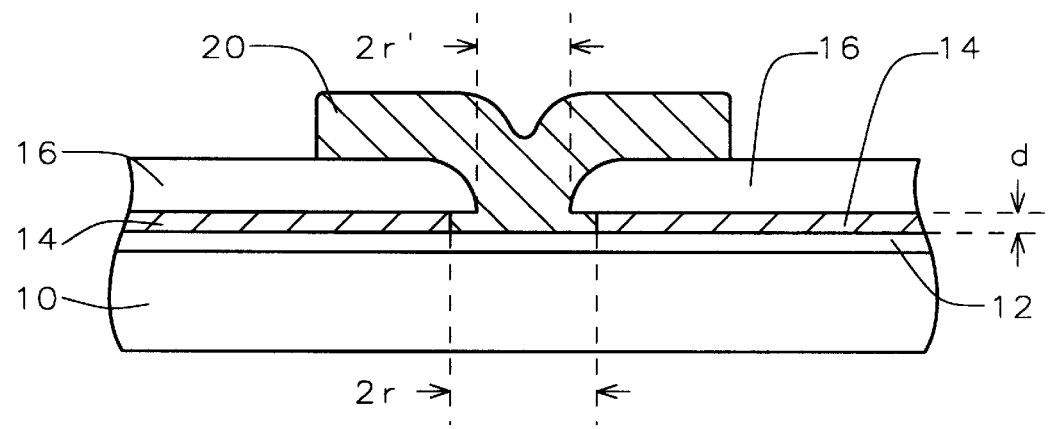
Figure 6:
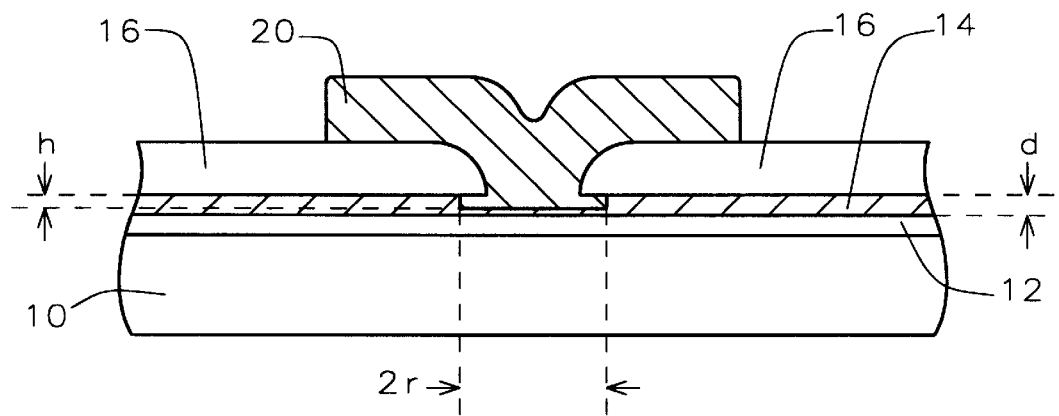

The second conducting layer 20 is now deposited to fill the via hole. This layer must be composed of aluminum or AlCu or AlSiCu and flowed at a temperature of between about 400 to 600° C. to fill the via hole under the undercut. The conducting layer 20 is patterned to complete the metallization. FIG. 5 illustrates a vertical via/contact in which the via hole is etched completely through the first conducting layer to the insulating layer surface. FIG. 6 illustrates a vertical via/contact in which the via hole is etched partially through the first conducting layer leaving a portion of the first conducting layer beneath the via hole.

Figure 1:
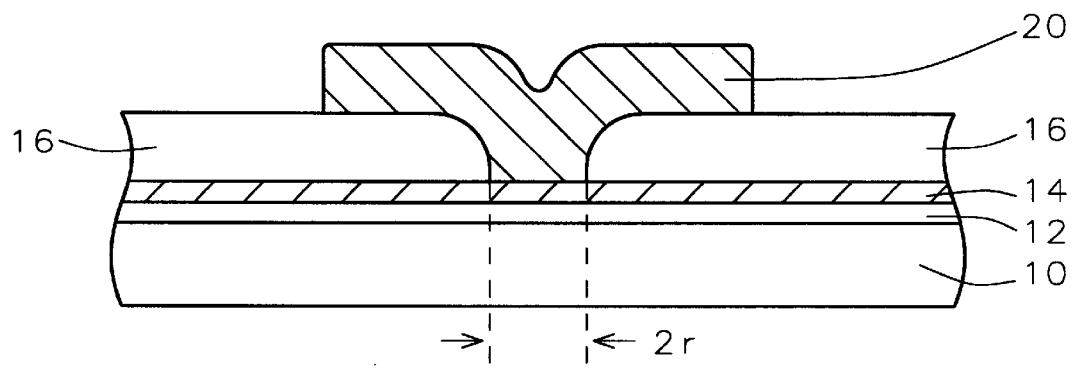
FIG. 1 schematically illustrates in cross-sectional representation a contact of the prior art.

A major advantage of the vertical via/contact structure of the present invention is increased interface area between the conductors. The diameter of the contact is 2r, shown in FIG. 1 of the prior art and in FIGS. 5 and 6. The interface area of the prior art contact is $\pi r^2$. The interface area of the partially etched out vertical via/contact illustrated in FIG. 6, where h<d, is $2\pi rh + \pi r^2$. The interface area of the completely etched out vertical via/contact illustrated in FIG. 5, is $2\pi rd$, which is greater than the prior art contact when 2d>r. In general, the damage, residue, or contamination is always on the top side of the first conducting layer in a via/contact. The lateral sides of the vertical via/contact structure do not have this problem. Thus, the process of the invention provides for removing the damaged top surface of the first conducting layer and does not allow for further damage, such as by ion bombardment or oxidation, to the conducting layer before the second conducting layer is deposited. Also, there is no polymer residue remaining on the surface of the first conducting layer. The process of the invention improves the mechanical properties of the interface between the two conducting layers because of the increased contact surface area and the absence of residue or damage on the surface of the first conducting layer.

EXAMPLE

The following Example is given to show the important features of the invention and to aid in the understanding thereof. Variations may be made by one skilled in the art without departing from the spirit and scope of the invention.

An example is given for 0.5 micron technology. As seen in FIG. 5, 2r' is the size of the opening in the dielectric layer. 2r is the size of the undercut via opening. If $2r'=0.5\mu$, $2r=0.6\mu$, $d=0.5\mu$, and $h=d$, then the prior art contact interface area=$\pi(0.25) \geqq =0.2\mu$ and the vertical via/contact interface area of the present invention=$2\pi(0.6) \geqq (0.5)=0.9\mu$. The interface area of the present invention is more than four times that of the prior art.

While the invention has been particularly shown and described with reference to the preferred embodiments thereof, it will be understood by those skilled in the art that various changes in form and details may be made without departing from the spirit and scope of the invention.

What is claimed is:

1. An integrated circuit device with vertical via/contact comprising:

an insulating layer covering semiconductor device structures in and on a semiconductor substrate;

a conducting layer overlying said insulating layer;

an intermetal dielectric layer overlying said conducting layer; and an aluminum layer overlying said intermetal dielectric layer and filling a via hole through said intermetal dielectric layer and through said conducting layer wherein said via hole includes an undercutting of said intermetal dielectric layer and wherein said portion of said via hole undercutting said interlevel dielectric layer has vertical sidewalls completing said integrated circuit device.

2. The device of claim 1 wherein said via hole extends partially through said first conducting layer.

3. The device of claim 1 wherein said via hole extends completely through said first conducting layer to the top surface of said insulating layer.

4. The device of claim 1 wherein said second conducting layer is composed of aluminum flowed at a temperature of between about 400 to 600° C.

5. The device of claim 1 wherein said second conducting layer is composed of an aluminum alloy flowed at a temperature of between about 400 to 600° C.

6. The device of claim 1 wherein said conducting layer comprises a contact metal layer overlying a barrier metal layer.

7. The device of claim 6 wherein said conducting layer further comprises an anti-reflective coating layer overlying said contact metal layer.

8. An integrated circuit device with vertical via/contact comprising:

an insulating layer covering semiconductor device structures in and on a semiconductor substrate;

a conducting layer overlying said insulating layer wherein said conducting layer comprises an antireflective coating overlying a contact metal layer overlying a barrier metal layer;

an intermetal dielectric layer overlying said conducting layer; and an aluminum-containing layer overlying said intermetal dielectric layer and filling a via hole extending through said intermetal dielectric layer and partially through said first conducting layer wherein said via hole includes an undercutting of said intermetal dielectric layer and wherein said portion of said via hole undercutting said interlevel dielectric layer has vertical sidewalls completing said integrated circuit device.

9. The device of claim 8 wherein said aluminum-containing layer is composed of aluminum flowed at a temperature of between about 400 to 600° C.

10. The device of claim 8 wherein said aluminum-containing layer is composed of an aluminum alloy flowed at a temperature of between about 400 to 600° C.

11. An integrated circuit device with vertical via/contact comprising:

an insulating layer covering semiconductor device structures in and on a semiconductor substrate;

a conducting layer overlying said insulating layer wherein said conducting layer comprises an antireflective coating overlying a contact metal layer overlying a barrier metal layer;

an intermetal dielectric layer overlying said conducting layer; and an aluminum-containing layer overlying said intermetal dielectric layer and filling a via hole extending through said intermetal dielectric layer and completely through said first conducting layer to said insulating layer wherein said via hole includes an undercutting of said intermetal dielectric layer and wherein said portion of said via hole undercutting said interlevel dielectric layer has vertical sidewalls completing said integrated circuit device.

12. The device of claim 11 wherein said aluminum-containing layer is composed of aluminum flowed at a temperature of between about 400 to 600° C.

13. The device of claim 11 wherein said aluminum-containing layer is composed of an aluminum alloy flowed at a temperature of between about 400 to 600° C.

* * * * *

UNITED STATES PATENT AND TRADEMARK OFFICE
CERTIFICATE OF CORRECTION

PATENT NO.   : 6,028,363
DATED        : February 22, 2000
INVENTOR(S)  : Yung-Fa Lin It is certified that error appears in the above-identified patent and that said Letters Patent is hereby corrected as shown below:

Title page,
Under Other Publications, at Attorney, Agent, or Firm; change the entry to read, --
George O. Saile, Stephen B. Ackerman, Rosemary L. S. Pike Signed and Sealed this Sixteenth Day of October, 2001

*Attest:*

*Attesting Officer*

NICHOLAS P. GODICI
*Acting Director of the United States Patent and Trademark Office*